COMPATIBLE PACKAGING OF MINIATURIZED CIRCUIT MODULES

Filed July 30, 1963 6 Sheets-Sheet 1

*INVENTORS*
ALFRED H. JOHNSON
WILLIAM R. McCONNELL
PETER R. SCHULZ
*BY* Donald R. Campbell
*ATTORNEY*

COMPATIBLE PACKAGING OF MINIATURIZED CIRCUIT MODULES

Filed July 30, 1963 6 Sheets-Sheet 2

Jan. 24, 1967 A. H. JOHNSON ETAL 3,300,686

COMPATIBLE PACKAGING OF MINIATURIZED CIRCUIT MODULES

Filed July 30, 1963 6 Sheets-Sheet 3

3,300,686

COMPATIBLE PACKAGING OF MINIATURIZED CIRCUIT MODULES

Alfred H. Johnson, Endwell, William R. McConnell, Johnson City, and Peter R. Schulz, Endwell, N.Y., assignors to International Business Machines Corporation, New York, N.Y., a corporation of New York Filed July 30, 1963, Ser. No. 298,603
The portion of the term of the patent subsequent to May 24, 1983, has been disclaimed
3 Claims. (Cl. 317—101)

This invention relates to the packaging of miniaturized solid state circuit modules on printed circuit cards, and more particular to a high density printed circuit package compatible to mounting both discrete components and solid state circuit modules.

A solid state circuit module as here used refers to a miniaturized functional circuit deposited on or attached to an insulating substrate. The functional or hybrid integrated circuit on the module normally includes a semiconductor device and is of the type suitable for use in business and data processing machines. Since the module circuits have a high density, the printed circuit package on which the modules are mounted must have a correspondingly high capacity in order to interconnect the modules efficiently and provide power and ground potential. Furthermore, provision is needed for mounting discrete components as it is not economically feasible to make up all the circuits needed in these machines using only modules.

Accordingly, an object of the invention is to provide a generally improved and more satisfactory printed circuit package compatible to mounting discrete components and miniaturized solid state circuit modules.

Another object is the provision of new and improved packaging of circuit modules so that a high degree of versatility is possible in interconnecting the modules in different combinations to perform various functions.

Yet another object of the invention is to provide a new and improved high density printed circuit package suitable for mounting modules which is economical, can be conveniently repaired, and is adapted to readily carry out engineering changes.

A further object is the provision of a high density printed circuit package for solid state modules and discrete components which is flexible in application and adaptable to logic circuit families having a speed as high as five nanoseconds.

A still further object of the invention is to provide a new and improved high density printed circuit package having similar or like parts for mounting modules, discrete components and interconnecting cables.

Another object is the provision of a new and improved printed circuit package adapted to be manufactured economically by reserving to the end of the processing those steps which distinguish one printed circuit card from another.

In accordance with the invention, the basic unit of the package is a plurality of small printed circuit cards plugged in approximately at right angles to a large printed circuit card. The small cards are multi-layered and have contact areas on either side at one edge to which are fastened contacts. A housing for the contacts is assembled to this edge of the small card. The remainder of the card has a grid of plated thru holes, and printed circuit lines connect the tabs and plated thru holes according to the desired pattern. The solid state circuit modules include a planar substrate having mounting pins projecting from one side. The modules are mounted on the small cards in a planar arrangement with the pins inserted in a group of plated thru holes. Discrete components of many types may also be mounted in the plated thru holes.

The large card is a multi-ply printed circuit board typically having internal voltage and ground planes and two external signal planes, although other arrangements are possible. Over most of the surface of the card is a grid of plated thru holes preferably having the same spacing as those in the small cards. The plated thru holes are typically interconnected by printed circuit lines which preferably extend largely in the "$x$" direction on one side and in the "$y$" direction on the other side of the card. Pins are fastened in selected ones of the plated thru holes, one side of the pins being the male connector portion on which the small cards are plugged, while the other side is available for discrete wiring and to receive the other plug-on connectors. Cable connections between large cards are handled by flat multiconductor cable secured to cable cards which are plugged onto the pins in the same manner as the small cards.

The foregoing and other objects, features and advantages of the invention will be apparent from the following more particular description of a preferred embodiment of the invention, as illustrated in the accompanying drawings wherein.

Figure 1:
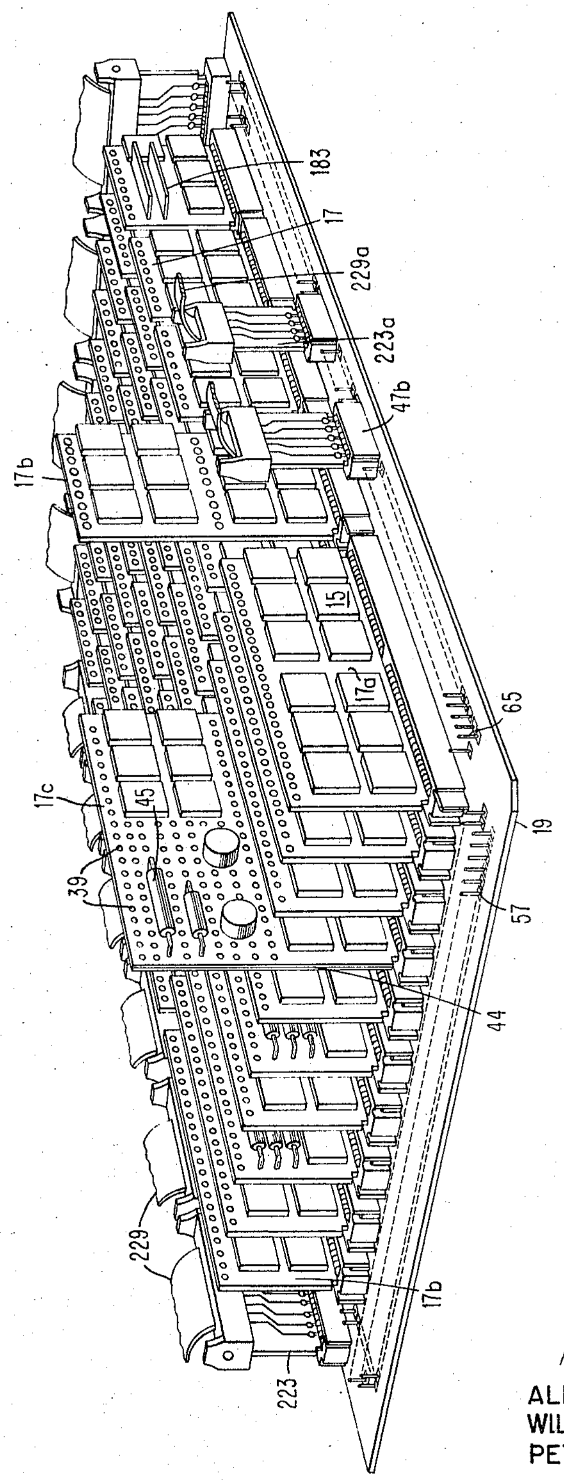
FIG. 1 is a perspective view of the card side of a large card on which are plugged various small cards and cable cards.

Referring to FIG. 1, the high density printed circuit package according to the invention employs a small card-on-large card principle where the small card is the smallest pluggable circuit or component vehicle and the large card is the basic building block. Generally speaking, miniaturized circuit modules 15 are mounted on small cards 17 which are in turn plugged in at right angles on a large card 19. Other sizes of small cards such as the small cards 17*a*, 17*b* and 17*c* are provided to accommodate the various circuit applications. Since the cards 17*a*, 17*b* and 17*c* have more component mounting area than the cards 17, these other small card sizes can be used to mount both discrete components 45 and circuit modules 15 (or, if it is desired, just one or the other type of component). Any number of the large cards 19, which is the basic building unit, can be mounted adjacent one another in a planar arrangement or in any other suitable manner relative to one another according to the number of circuits desired for the application. The large cards are interconnected with one another and with external devices by means of flat cable 229 attached to cable cards 223, 223*a* which are also plugged into the large cards. The cable cards can be made in various sizes and are normally plugged into the outer rows at the four sides of the large cards. The various sizes of small cards 17, 17*a*, 17*b* and 17*c* may be plugged in at any location on the large card 19, but are conveniently mounted in vertical rows in the inner area of the large card 19.

Figure 2:
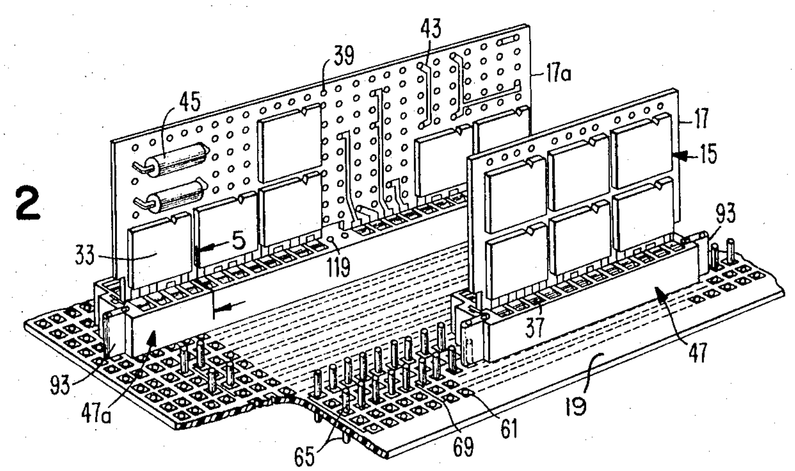
FIG. 2 is a perspective view to an enlarged scale of several small cards mounted on a large card, the large card being broken away.
Figure 3:
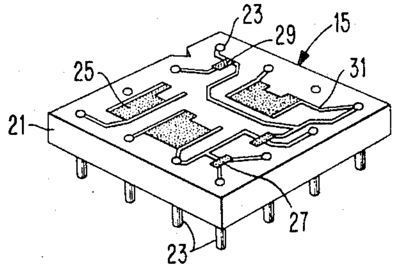
FIG. 3 is a perspective view to an enlarged scale of one of the miniaturized circuit modules shown in FIG. 2.

The small card-on-large card principle can be understood better by referring to FIG. 2. Six of the circuit modules 15 are mounted side-by-side in a planar arrangement on the small printed circuit card 17 which is in turn pluggably mounted approximately at right angles to the large card 19. Each of the modules 15 (see FIG. 3) has an insulating substrate 21 which is preferably square and is made of a suitable ceramic material such as aluminum oxide. Terminal and connector pins 23 are fastened to the substrate 21 in rows adjacent each of its edges and project from its bottom surface forming a square pattern of pins of about the same length. On the top of the substrate 21, connecting with the terminal pins 23, are various passive and active electronic components which are interconnected by printed circuit lines. Typically, a module circuit comprises painted-on resistors 25, and chip diodes 27 and transistors 29 interconnected with one another and the terminal pins 23 by painted-on printed circuit lines 31. The chip diodes and transistors are mounted on the substrate by solder reflow. The miniaturized circuit on the modules 15 are preferably logic circuits suitable for use in computers and data processing and business machines of various types, but the type of circuit contained on the modules 15 is immaterial as to this invention. A protective coating 33 of varnish or the like, not shown in FIG. 3, is normally applied to the circuitry on the modules. For further information on the module, refer to the copending application of E. M. Davies, Jr. and A. H. Mones, S.N. 300,734 filed August 8, 1963, and assigned to the same assignee as the present invention.

The small card 17 is made from double-sided copper-clad epoxy glass or epoxy paper printed circuit material. One edge of the card 17 has a plurality of terminal areas or contact tabs 35 to which are soldered, on either side of the card, a plurality of U-shaped springs 37 forming a part of a connector for plugging these small cards onto the large card. The remainder of the surface of the card 17 has a rectangular grid pattern of plated thru holes 39 each end of which connects with an annular land area 41 on either side of the card. The plated thru holes 39 and the two connecting annular lands 41 can be said to be rivet-shaped. Etched printed circuit lines 43 on either side of a card connect the plated thru holes with each other or with the contact tabs 35. The terminal pins 23 of the modules 15 are inserted through a group of plated thru holes 39 and dip soldered. It is obvious that the required signal, ground and supply voltages can be supplied into the miniaturized circuits on the modules 15 through the connector springs 37 and that the modules may be interconnected with one another through the printed circuit lines 43. The modules 15 are, for instance, slightly less than about ½" square, and the terminal pins 23 are spaced 0.125" from one another on a ⅜" square. Although not here illustrated, there may be pins at the corners of the internal ⅛" square. Accordingly, the plated thru holes 39 are on a 0.125" grid, and the small card 17 including the contact tab area is just less than 1½" high and 1¾" wide.

Since it is not economically feasible to manufacture modules for many low-volume special non-logic circuits, it may be necessary to use standard discrete components to fabricate some of the circuits. Furthermore, some applications may make it convenient to use a larger component or module mounting area than has the card 17. The small card 17*a* (FIG. 2) is identical to the small card 17 except that it is twice as long and contains a mixture of modules 15 and discrete components 45. The leads of the discrete components 45 are bent at right angles and inserted through the plated thru holes 39 and clinched to the card as by swaging the leads. The small card 17*a* can be called a 12-pack card. However, it will be understood that either of the small cards 17 or 17*a* may comprise solely modules, a mixture of modules and discrete components, or solely discrete components. The larger card 17*a* has more component mounting area compared to the available contact count and will therefore find most use in functional logic using modules or in applications requiring discrete components.

The small card 17*b* shown in FIG. 1 has the same width as the card 17 but is twice as high. The cards 17*a* and 17*b*, therefore, have the same component or module mounting area. The small card 17*c* is as wide as the 12-pack card 17*a* but is twice as high and therefore has two or four times the component or module mounting area than have the other small cards. To service such a large area, the card 17*c* may have one or two innerplanes 44 carrying supply or ground voltages. These innerplanes are structurally identical to the innerplanes of the large card 19 which will be explained later. If desired, innerplanes may be also supplied in the cards 17*a* and 17*b*. Although small cards of the two heights are illustrated in FIG. 1 as being plugged on the same large card 19, it will be understood that ordinarily small cards of just one height are used on one large card. By similar reasoning, there can be triple high small cards which are multi-layered (i.e., two or more planes).

The small card 17 is plugged into a housing 47 (FIG. 2) which forms part of the connector between each of the small cards and the large card. The housing 47 has an electrical insulation and protective function, and serves to preload and mechanically position the contact springs for plugging onto the male part of the connector on the large card 19. The 12-pack card 17*a* has a similar housing 47*a* which is nearly identical to the housing 47 except that it is about twice as long. For some small cards 17 and 17*a*, it is not necessary to have a contact spring 37 for each of the terminal tabs 35, since the necessary electrical connections can be made without the use of some of the terminals. The printed circuit card connector functions well when some of the spring contacts 37 are not present.

Figure 5:
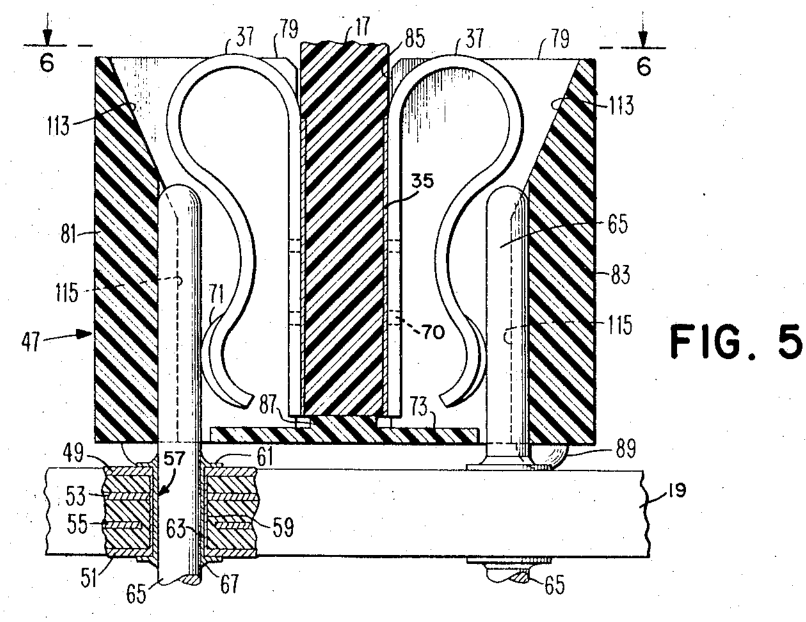
FIG. 5 is a cross-sectional view of FIG. 2 taken substantially on the line 5—5 showing features of the construction of the spring connector between the small cards and the large card, portions of the large card being illustrated in section.
Figure 6:
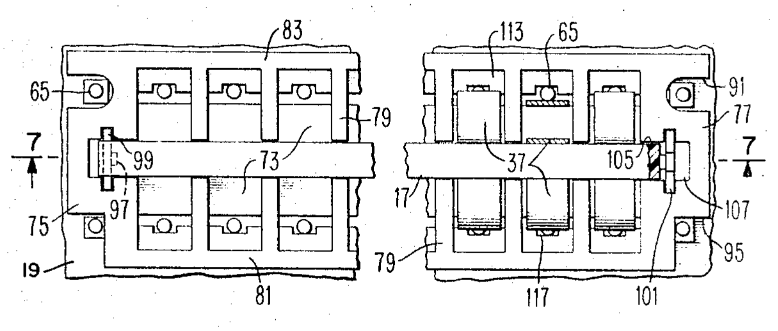
FIG. 6 is a partial plan cross-sectional view, to a reduced scale, taken approximately on line 6—6 of FIG. 5, parts being shown broken away and some of the springs having been removed.

Referring to FIGS. 2 and 5, the large card 19 is a four-ply epoxy glass or epoxy paper printed circuit board having two external signal planes 49 and 51 and internal voltage and ground planes 53 and 55. Preferably the material from which the large card is cut is a laminate of copper foil sheets between which is disposed suitable insulating material, the layers being molded together under heat and pressure. As used in this specification and in the claims, a multi-layered printed circuit card is defined as a laminated assembly of conductor configurations existing at three or more planes separated from one another by insulating sheets. The small cards are made from the same material and have at least two copper-clad surfaces and possibly one or more innerplanes. Consistent with the dimensions previously given, the large card 19 is about 8" x 12" and has over most of its surface a rectangular grid of matrix of plated thru holes 57 at a 0.125" spacing, i.e., at intersections of all vertical and horizontal lines spaced ⅛" from one another. The plated thru holes 57 are preferably manufactured by drilling or punching holes in the printed circuit board material and initially plating the bores of the holes with a layer 59 of copper formed of a coating of electroless copper followed by electroplated copper until the desired thickness is built up. As is known in the art, copper can be deposited onto the surface of non-conductors or plastics by chemical reduction after first having properly sensitized and activated the surface. Conventional techniques may then be employed to electroplate copper onto this initial coating until the desired thickness is obtained. Then the bores of the holes at connecting square land areas 61 on the surfaces of the board at either end of the holes are given an overlying layer 63 of electroplated tin-lead. The result is a rivet-shaped plated thru hole comprised of a layer of copper and a coating of tin-lead.

Round pins 65 are inserted into selected ones of the plated thru holes 57 in the large card and electrically and mechanically fastened approximately perpendicular to the card with their ends projecting from either side of the card by about like amounts. Preferably, the pins 65 are swaged to the card at either side and soldered by dropping a solder ring over the end of the pin, one side at a time, and heating in an oven or dipping into hot oil at about 390° F. for about 4½ minutes. The soldering creates fillets of solder 67 between each pin 65 and its respective plated thru hole. One end of the pins on one side of the large card 19 is available to serve as the male portion of the spring connector between the small cards and the large card. The other ends of the pins 65, at the other side, are preferably squared up and are available for engineering changes or field repairs or special wiring as for instance by welding or wire wrapping discrete wires between selected pins. The pins 65 are placed into the large card 19 in pairs of rows parallel to the long side of the card with one blank row of plated thru holes between each pair of rows, the pairs of rows being spaced from each other by two blank rows of plated thru holes. At the top and bottom of the large cards are pairs of rows of pins running parallel to the short side of the card, to receive cable cards for making cross-over connections to adjacent large cards. Printed circuit lines 69 connect the square land areas 61 of the plated thru holes according to the desired pattern.

A more detailed description of the preferred embodiment of the printed circuit card connector, which is essentially the same for all sizes of small cards, will now be given. As was mentioned previously, the contact springs soldered to the opposite sides of the contact tabs 35 of the small cards 17 and 17*a* are generally U-shaped. For ease of fabrication and to obtain adequate contact forces, the contacts 37 more particularly are formed with a straight leg to be soldered to the small cards and a semi-circular bight portion, while the other leg has a sinuous shape. In its unstrained condition, the other leg comprises an inwardly curved arcuate section which connects at its top with the semi-circular bight and at its bottom with an outwardly curved arcuate section. The free end of the spring curves inwardly and terminates a short distance above the bottom of the straight leg. The straight leg or back portion of the spring desirably has two holes 70 to facilitate soldering to the contact tabs 35. To assure minimum contact resistance with low voltages under all conditions of use, it is desirable to have a gold-to-gold contact between the springs 37 and the pins 65. For this reason, the pins 65 are preferably gold plated and the outwardly curving portions of each of the springs 37 just above the inwardly turned free end are provided with a gold dot or point 71.

Figure 4:
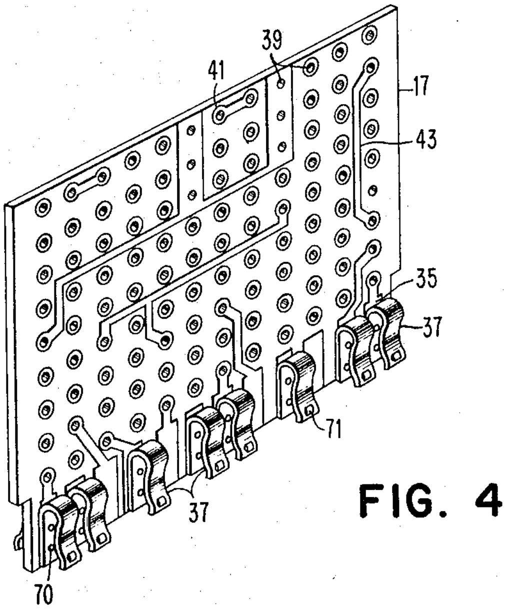
FIG. 4 is a perspective view to an enlarged scale of the reverse side of one of the small cards shown in FIG. 2, the modules and housing having been removed as well as some of the contact springs.

The housing 47 is a frictionally retained type so that plugging a small card 17 with the springs 37 soldered on as shown in FIG. 4 into a housing automatically assembles the housing to the end of the card. At the same time the spring contacts 37 are preloaded and mechanically aligned and positioned whereby the small card with its housing can be easily plugged down onto a pair of rows of pins 65. The housing 47 (see FIGS. 5–8) is a one-piece molding made of a suitable insulating material such as plastic. Basically, it is a four-walled elongated rectangular structure having a generally open top and a wide bottom rail 73 extending between the end walls 75 and 77. Pairs of longitudinally spaced partitions or separators 79 extend toward one another from the two side walls 81 and 83 defining a longitudinal opening 85 into which the small card may be inserted. The separators connect at the bottom with the rail 73, which also has a central rib 87 on which the small card rests to elevate it within the housing. The contact springs 37 are received within the openings formed between the separators 79 at either side.

The housing 47 has at its corners four tiny feet or bumps 89 which elevate the bottom of the housing above the surface of the large card 19 to allow space for the solder fillets 67. The two end walls 75 and 77 also have U-shaped notches 91 to receive flattened oval locators 93 (FIG. 2). The locators 93 fit down over two of the pins 65 at predetermined locations on the large card 19 and assure that all of the small cards or cable cards are assembled on the large card in the proper orientation. The other two corners of the housing 47 are relieved or notched at 95 (see FIG. 6) to provide clearance for the interfering pins in the other row when the housing is mounted on the large card.

Figure 7:
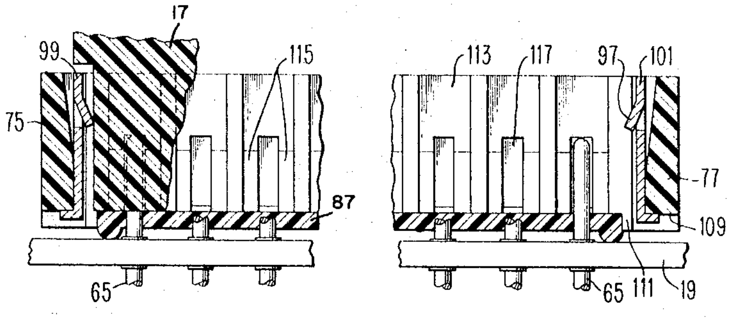
FIG. 7 is a partial elevational cross-sectional view taken substantially on the line 7—7 of FIG. 6, parts being broken away and some of the springs having been removed.
Figure 8:
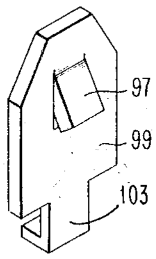
FIG. 8 is a perspective view, on an enlarged scale, of the retainer shown in FIGS. 6 and 7.

Upon inserting the small card into the housing, FIG. 7, the housing is assembled to the small card with a frictional action by means of downwardly sloped struck-out projections 97 on retainers 99 and 101 supported in the two end walls of the housing. It is readily apparent that once the small card has been inserted in the housing, the struck-out projections or tangs 97 dig into the edges of the printed circuit card material to prevent its withdrawal unless considerable force is used as the card is wiggled back and forth. The retainers 99 and 101 are identical and basically L-shaped. Each comprises a small, flat plate from which the tang 97 is struck out and at one end of which is an L-shaped leg 103 having a bent over lug at its free end.

Each of the housing end walls 75 and 77 has a vertical recess 105 (FIG. 6) for receiving the side edge of a small card, and connecting with this recess is a T-shaped opening 107 for receiving one of the small card retainers. Although T-shaped at the top, the leg of the opening 107 tapers inwardly toward the cross bars as shown best in FIG. 7. In assembling the retainer 99 or 101 in the housing, the flattened plate portion of the retainer is received in the cross bars of the T and the bent over lug on the retainer leg 103 is in engagement with the tapering surface of the leg of the T. Upon pushing the retainer into the opening, the retainer leg is stressed as it slides down the tapering surface and snaps over into a groove 109 in the bottom of the housing when it reaches the end of the opening. There is a square hole 111 in the bottom of the end wall to accommodate the bent over lug as it is being inserted and to facilitate its convenient removal by using a pointed tool to push the lug back in the groove 109 until it snaps past the end of the groove and can be pushed upwardly in the housing to remove the retainer from the top of the T-shaped opening 107.

It is obvious that the separators 79 insulate the contact springs 37 one from another after insertion into the housing. To mechanically position the springs within the housing, the side walls 81 and 83 have opposing ramps 113 which initially slope downwardly and inwardly, and at a point about half-way down the height of the housing, continue on as opposing vertical surfaces 115. Upon inserting the small card with the attached contact springs 37 into the housing 47, the gold points 71 on the outwardly curving lower ends of the springs engage the ramps 113 and slide down the opposing slopes onto the vertical walls 115, coming to rest against the vertical wall surfaces when the card is fully inserted. To receive the pins 65, the ramps 113, between each pair of adjacent separators 79, have opposing centrally located vertical notches 117. The notches 117 extend the full length of the vertical wall surfaces 115 and also extend upwardly into the lower ends of the opposing slope portions of the ramps 113. The notches 117 are considerably wider than the diameter of the pins 65 to accommodate bent pins but leave ramp surfaces 113 including vertical wall portions 115 adjacent each side of the separators 79. The width of the outwardly curving free end portions of the contact springs 37, in the area of the gold dots 71, is obviously greater than the width of the notches 117 so that the springs engage the ramps 113 and vertical walls 115 as the small card is being inserted in order to pre-load them, rather than falling into the notches 117. It will be observed that the only openings in the bottom surface of the housing 47 are the T-shaped openings between the separators 79 formed by the edge of the bottom rail 73 and the opposing edges of the vertical walls 115 and the notches 117. The transverse width of these T-shaped openings, from the bottom of the notch 117 to the edge of the bottom rail 73, is considerably greater than the diameter of the pins 65 to allow for bent pins. When plugging the assembled small card and housing down onto the large card 19, the pairs of rows of pins 65 enter the notches 117 and engage the gold points 71 of each of the contact springs, deflecting the free ends of the contact springs inwardly to stress them and provide proper contact forces. As shown in FIG. 5, the contact springs engage the insides of the two rows of pins 65.

The housing 47*a* (FIG. 2) for the 12-pack small card 17*a* comprises essentially two of the shorter housings 47 joined end to end. A slight change is that four bore holes 119 are provided at the center of the housing 47*a* to receive those pins 65 lying between the two groups of contact springs on the card 17*a*. The use of only two small card retainers 99 and 101 at the extreme ends of the housing 47*a* is required.

An advantage of this printed circuit card connector is that the contact springs 37 are pre-loaded and mechanically positioned so that the insertion forces required to plug any of the various sizes of small cards or to the large card 19 are not excessive. For a further explanation of this, reference may be made to the article "Restrained Spring Electrical Connectors" in the May, 1961, issue of the IBM Technical Disclosure Bulletin (volume 3, No. 12, page 11). An even more important advantage of this connector is that by this design the socket is on the removable small cards and thus the large card 19 can be made relatively simple and inexpensive. The cost of the large card pins 65 and their assembly to the large card is relatively small, and furthermore, the pins 65 can be programmed for insertion into selected rows of the plated thru holes 57 or in individual positions anywhere on the card. The greater part of the cost of the connector appears in the soldered-on contact springs 37 and the housings 47 or 47*a*, but since the socket appears on the removable small unit, this means that the socket appears only when it is used. Thus, blank small card positions on any large card do not have sockets since the small card is not present. Because the large card 19 is simple and inexpensive, engineering changes by means of removing a large card and replacing it by a different large card with different printed circuit lines patterns or different pin arrangements is facilitated. Additional savings which become considerable when the volume is high are possible because the contact springs 37 need not be soldered at all contact tab positions on the small cards when they are not needed, as is shown in FIG. 4. The connector is designed to give a minimum of 200 grams of contact force between each spring 37 and pin 65. With gold-to-gold contact areas, this is sufficient for circuits using low voltage supplies such as +6, +3, −3 and 0 volts. For further information on the spring connector, see the copending application of W. R. McConnell and P. R. Schulz, S.N. 298,695 filed July 30, 1963, and assigned to the same assignee as the present invention.

Before further describing the large card 19, a review of the type of circuits being packaged will be helpful. This printed circuit package is intended primarily for use in a large variety of types and sizes of computers and data processing and business machines, and particularly the logic sections. The manufacture of circuit modules such as that illustrated in FIG. 3 is not economically justified unless the usage of each module type is large. The logic sections of these machines are especially adapted to be made up of modules in view of the repetitious nature of the basic units making up these circuits. The majority of the logic circuits required in a particular machine can be made up of various combinations of standard circuits which are packaged as modules, for instance, fewer than 10 modules for a logic family. Some special circuits, such as terminators and relay drivers, are still needed and are made up of discrete components since the usage is not great enough to manufacture modules.

Figure 9:
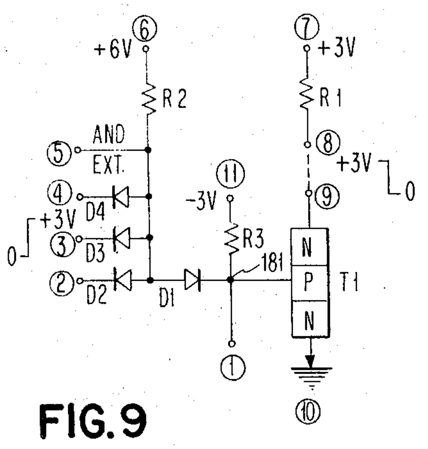
FIG. 9 is a circuit diagram of an exemplary circuit on a typical module.

In FIG. 9 is shown the circuit of a typical module for use as a basic building unit in a medium speed (30 nanoseconds per decision) logic family. This module is the one physically pictured in FIG. 3 and has an And Invert function. In this diagram the circled numbers refer to the terminal pins 23 of FIG. 3, which are numbered consecutively in clockwise order with the orientation notch occurring between pins 9 and 10. Transistor T1 is an NPN transistor having its emitter connected to ground and its collector connected through resistance R1 to a +3 v. supply. The conductor between pins 8 and 9 is provided by printed wiring on the surface of the small card and for this reason is shown dotted. The output is off of pin 9 and has a nominal level of +3 v. or 0 v. The base of T1 is connected between resistor R3 and diode D1 which are part of a base network also including resistor R2. The leg of the base network containing R2 is connected to +6 v. while the other leg is connected to −3 v. Diodes D2, D3, and D4 are connected as a positive AND circuit between resistor R2 and diode D1. The nominal input signal levels are 0 v. and +3 v. Sample values for the resistances are: $R1=750$ ohms, $R2=2K$ ohms; and $R3=3.6K$ ohms.

Considering the operation of this circuit, it is seen that a 0 v. level at any one of the input pins 2, 3 and 4 of the AND circuit causes the tap point 181 of the base network to go negative, turning off transistor T1 with a resultant +3 v. output level at pin 9. Coincidence of +3 v. levels at all of the pins 2, 3 and 4 causes all of the diodes to conduct and point 181 goes positive, turning on T1 and producing an output level of 0 v. An inversion of the input signal occurs at the saturating transistor inverter T1. It will be noted that additional inputs to the AND circuit may be provided at pin 5. Also, pin 1 connects between D1 and tap point 181 and is available to connect in diodes poled in the same direction as D1. This results in an And-Or-Invert circuit function.

Examples of the functions provided by other modules needed to make up the majority of circuits in a medium speed logic family are the following: And-Or Invert, Direct Coupled Inverter, And Power Inverter, And-Or Extender, Four Transistors, Four Double Diodes, Indicator Coupling Network High Power Driver, and Line Sensing Amplifier. Line terminating networks may be provided in module packaging or by a special R pack or RC pack. A "pack" is illustrated at 183 in FIG. 1 and can be provided in different sizes of substrates which ordinarily are rectangular in shape and mounted perpendicular to a small card. These modules and packs may be connected with one another in many different ways to provide the necessary circuitry for the particular logic desired. Furthermore, these basic modules can be connected together to make larger circuits in a manner well known in the art, such as forming an AC Trigger from two And Inverter Modules, one And-Or Extender module, and a C pack or an RC pack. For this particular circuit family, supply voltages of +6 v., +3 v., −3 v. and ground are required.

For versatility of application to various machine requirements, a high speed circuit family (about 5 nanoseconds per decision) is provided and also a low speed circuit family (about 700 nanoseconds per decision). Each of these logic circuit families has a similar group of modules from which the majority of the circuitry for a particular machine can be built up, special circuits and the like being made from discrete components. As a general comment, it can be said that most of the modules contain solid state circuits including semiconductor devices, but some modules might have only passive components such as resistors. Another general statement that can be made is that each machine has some special circuits which must be built up out of discrete components since the volume is not high enough to warrant manufacturing modules. The printed circuit card arrangement on which the modules and discrete components are mounted should be adapted to package circuit families of all three speeds. Additionally, there should be considerable versatility in interconnecting the various small cards and modules to make up the innumerable logic circuit configurations that may be required.

To obtain the necessary printed wiring density, the large card 19 is a multi-ply laminated circuit board which has been described as having two outer planes 49 and 51 and at least two innerplanes 53 and 55. The outer planes 49 and 51 contain signal wiring, and the innerplanes 53 and 55 distribute the supply voltages required by the modules and discrete components. The innerplanes also provide a shielding function, and are used to maintain a fairly constant transmission line impedance, which is more necessary and becomes more critical for the higher speed circuits. One of the innerplanes, the plane 53, is ordinarily essentially a voltage plane, which the other innerplane, the plane 55, is ordinarily essentially a ground plane.

Figure 10:
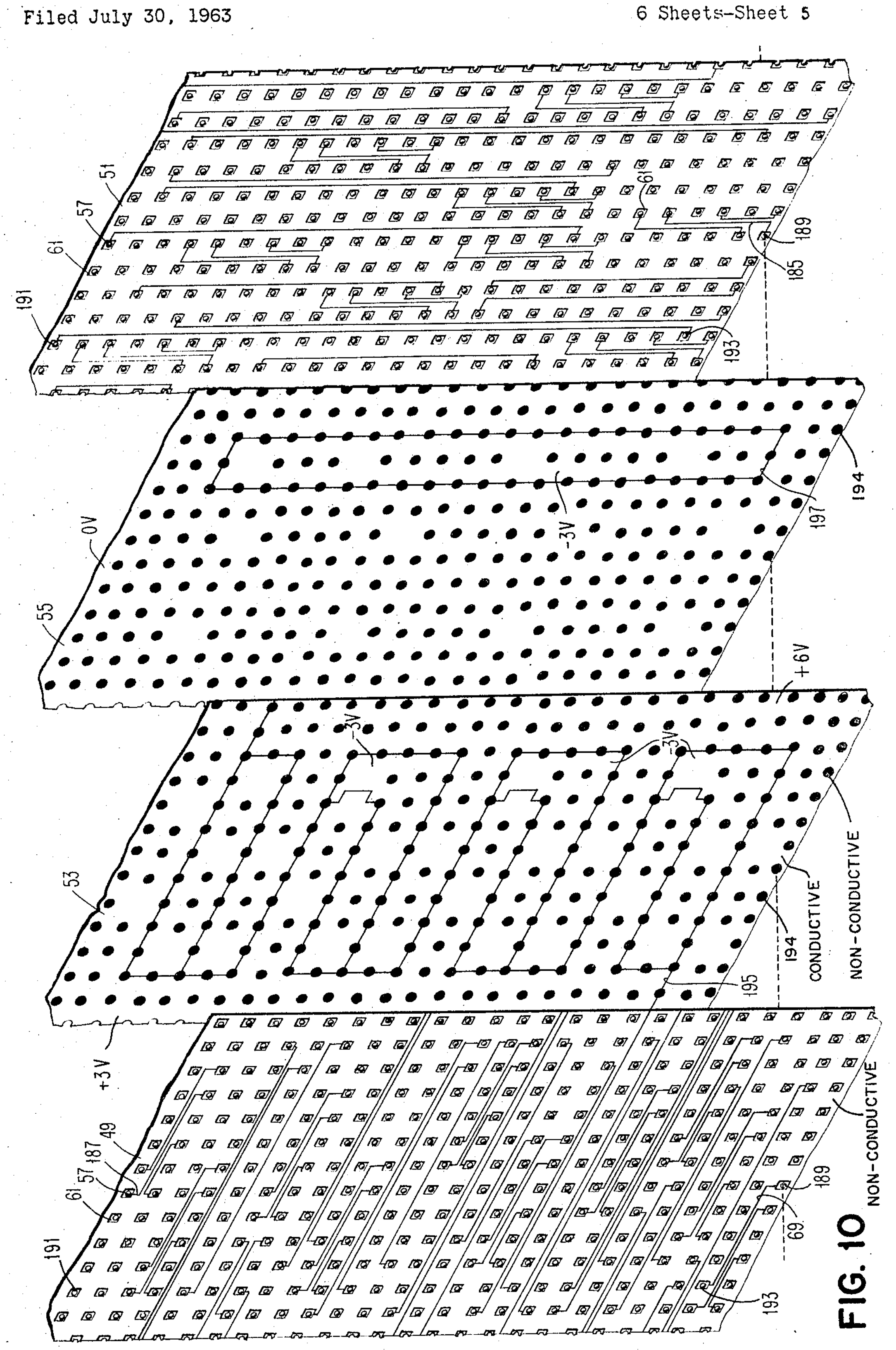
FIG. 10 is an exploded diagrammatic partial view of the large card printed circuit planes.

It will be recalled from the discussion of FIGS. 1, 2 and 5 that the small cards 17, 17*a*, 17*b* and 17*c* are arranged on the large card 19 vertically by columns and horizontally by rows. The 6-pack card 17 and the double high card 17*b* are considered to take up one row, while the 12-pack card 17*a* and the double high card 17*c* take up two rows. Furthermore, the pins 65 are arranged in pairs of rows, each pair of rows being spaced by two blank rows of the plated thru holes 57. Although small cards may be plugged on at any position on the large card, the endmost columns at either side of the card and the horizontal rows of pins at the top and bottom of the card are generally reserved for the cable cards. Sample layouts are shown in FIG. 10 of printed circuit patterns for the large card planes 49, 53, 55 and 51. The patterns are somewhat diagrammatic due to the impossibility of showing thousands of plated thru hole positions but illustrate the principle. Furthermore the cable card positions are not shown in this partial view. The outer signal planes 49 and 51 each have a rectangular grid of square land areas 61 each of which connects with a plated thru hole 57. The printed circuit lines 69 on the card side of the large card connect selected ones of the square land areas 61 and extend generally in the horizontal or "*x*" direction. In the plane 51 at the back or probe side of a large card, the square land areas 61 of the plated thru holes are connected in the desired pattern by printed circuit lines 185 which generally extend in the vertical or "*y*" direction. This is further explained in the article entitled "A Wiring Procedure" in the August, 1961, issue of the IBM Technical Disclosure Bulletin (volume 4, No. 3), page 29. Orthogonally directed line spurs 187 connect the printed circuit lines 69 and 185 with the square land area 61 adjacent each end of the line. As an example, wire routings from a particular plated thru hole 189 to a diagonally located plated thru hole 191 can be achieved by an X direction line 69 connected to intersecting hole 193, the signal passing through the plated thru hole to a Y direction line 185 which connects with the land area of the plated thru hole 191. Desirably the lines 69 and 185 are formed by the "Printed Circuit Generator" described in the article by that name in the December, 1961, issue of the IBM Technical Disclosure Bulletin (volume 4, No. 7), page 11. Basically, the process is to coat the unetched copper foil with a photoresist which is exposed by a spot of light by moving the foil and spot relative to one another on orthogonally moving servo tables. The unexposed resist is washed away and the exposed copper foil is etched away to leave the desired line pattern. With this technique, reliable printed circuit lines can be produced having a width as little as 0.010″. As many as three parallel lines 69 and 185 may be provided between adjacent square land areas 61 of plated thru holes whose centers are spaced 0.125″ from one another.

The two innerplanes 53 and 55 have a shielding function and, contrary to the illustration of the outer planes, the conductive surface is shown in white. For these planes (see also FIG. 5) a negative or non-conductive annular land area 194 is created in the foil, as by etching, when it is not desired to connect to a plated thru hole 57. The plane 53 adjacent the card side of the large card 19 is essentially a voltage plane. Negative or non-conductive lines 195 extend through various negative land areas in repeating patterns to create areas which are electrically isolated from one another. The required supply voltages are distributed through these areas. For instance, the area at the top of the plane and extending down the left side with inwardly extending fingers is a +3 v. area. The opposing area at the bottom of the card extending upwardly at the right side with inwardly extending fingers is a +6 v. area. Between these areas are −3 v. areas which are not electrically connected together with one another on this plane. With the exception of the two outer columns which are normally reserved for cable cards, it is seen that there are horizontally extending voltage bars in repeating groups of +3 v., −3 x. and +6 v. The spacing of these voltage groups corresponds to the rows on the large card for receiving the 6-pack size small card 17 or 17*b* or one-half of the 12-pack size small card 17*a* or 17*c*. Thus each small card unit size can be supplied with each of +3 v., −3 v. and +6 v. by failing to leave a negative land area in the correct location for each small card position. By running the signal conductors 69 adjacent to the voltage plane 53 parallel to the voltage bars (i.e., horizontally), noise coupling is reduced while a nominal characteristic impedance is maintained for all signal lines on the board. This is of particular importance for the high speed circuits.

The ground plane 55 is essentially all at ground voltage with the exception of an isolated rectangular area created by the negative printed circuit lines 197. This enclosed area is connected to −3 v. and serves as a bus connecting together the −3 v. areas on the voltage plane 53. This bus, it will be noted, extends in the same direction as the vertical printed lines 185. Negative land areas in the ground planes 55 are omitted when it is desired to connect with a plated thru hole in each of the small card positions. There will of course be a pin 65 soldered in this particular plated thru hole so that the ground can be transmitted to the small card. Those plated holes 57 in which no pin is soldered are known as via holes.

Figure 11:
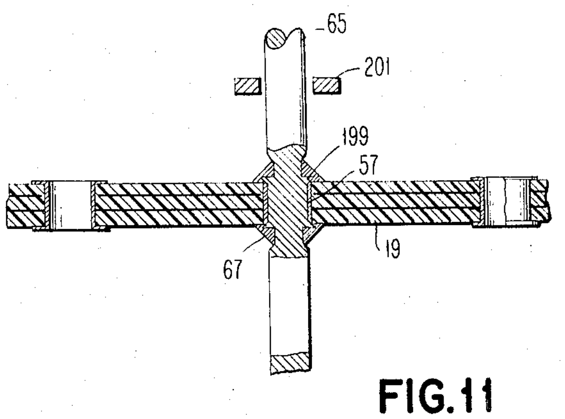
FIG. 11 is an enlarged partial cross-sectional view through several of the large card plated thru holes, parts being shown broken away.

FIG. 11 illustrates a detail in the assembly of the pins 65 in the plated thru holes 57 in the large card 19. The pins 65 are swaged to the card at either side at opposing circumferential points. The swaging causes cold flow of the metallic pin producing opposing projections of metal 199 which overhang the surface of the large card. In this manner the pin 65 is mechanically fastened to the large card at two points on either side. The remainder of the circumference of the pin is undisturbed. Thus a solder ring 201 can be dropped down over the pin and, upon being oven baked or dipped in hot oil at about 390° F. the solder ring melts and is able to run down the surface of the pin to the area inside the large card between the hole and the pin to create a good solder joint. The swaging holds the pin upright within the card during the soldering operation and increases the pullout strength of the pin in the finished large card. Also, subsequent melting of the solder connection as during repair work will not alter pin alignment.

Figure 12:
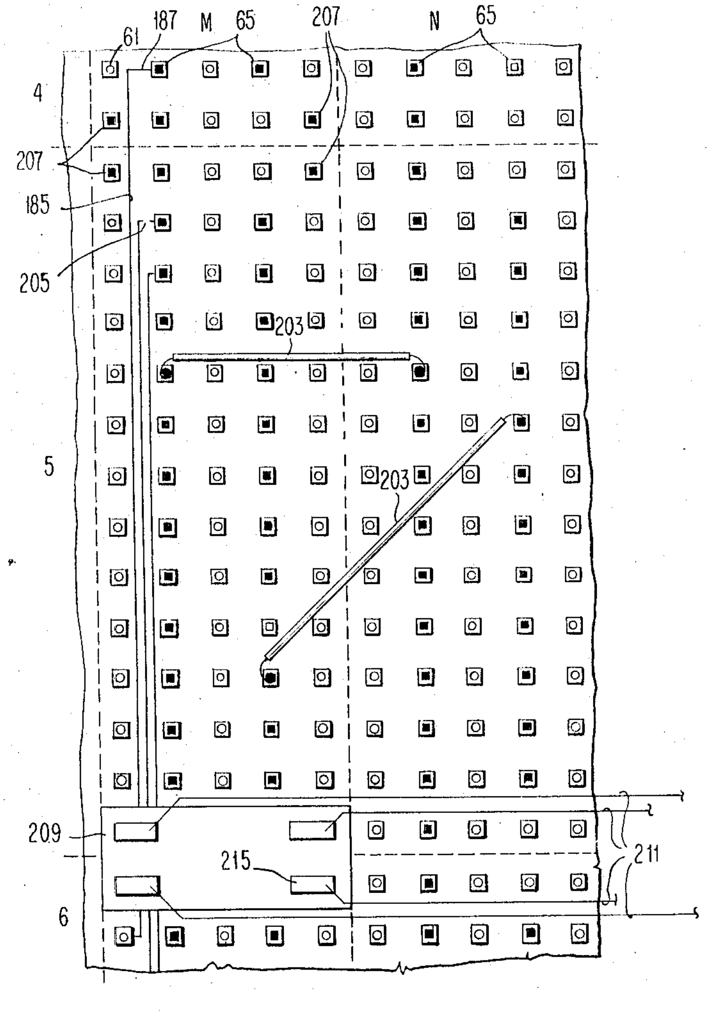
FIG. 12 is a plan view of a portion of the back or probe side of a large card.

Desirably the back or probe side of the pins 65 is squared up to permit conventional wire wrapping (see Patents 2,759,166 and 2,870,241) between selected pins. In view of the high cost of gold plating, this side of the pins is desirably not gold plated but is plated with a metal such as tin-lead that is resistant to printed circuit etchants for a purpose to be explained later. Of course, the entire pin can be made of a metal resistant to these etchants in which case selective gold plating on the card side is only needed. For instance, the pins can be made of "A" nickel, which is resistant to ammonium persulfate. In FIG. 12, the squared-up probe side pins are blackened tin to make them more visible. Since this is the back side of the large card, the printed circuit lines 185 are shown extending in the vertical direction. Discrete wires 203 are wire wrapped at either end around selected pins, interconnecting them. There may be several reasons for using discrete wires on the probe side of the card. One reason is that it may not be possible to achieve the desired wire routing by means of the printed circuit horizontal lines 69 and vertical lines 185 on the signal planes. Or it may be difficult to design these wire routings by design automation, and in either case, discrete wiring may be resorted to. An even more important reason is to facilitate engineering change activity and field repairs. Engineering changes by means of adding wiring can be done in this manner by a field engineer even after a machine containing this type of package has been placed in service. Furthermore, there may be breaks in the printed wiring which may be most easily repaired by discrete wiring between pins. Another facet of engineering change activity is the elimination of wiring. Printed wiring can be broken conveniently by cutting the spurs 187 which connect the horizontal or vertical printed circuit lines to the square land areas 61. In some cases, a cutting tool having an axial bore can be slid down over the pin 65 and rotated to conveniently make the break, as at 205.

For a large card 19 having the previously given size of about 8" x 12" with the plated thru holes 57 on a 0.125" rectangular grid, there are over 6,000 plated thru holes. A pair of small card or cable card positions are shown in FIG. 12 and are seen to require a block of plated thru holes 5 wide and 14 deep. In the vertical direction, 12 of the pins are required for the contact springs 37 on each of the small cards and cable cards, while the extra pin above and below in one row is for receiving one-half of the oval locator 93 (FIG. 2). For a large card with these dimensions, there are 13 colunms (i.e., small card or cable card mounting positions) and eight rows. Of these 8 rows, rows 1 and 8 at the top and bottom of the card have the horizontal pairs of rows of pins and are reserved for mounting cable cards. The central rows 2 to 6 are available for mounting small cards. In FIG. 12, two complete small card mounting positions are illustrated, namely row 5, columns M and N.

In column M it will be noted that the pin pattern is altered slightly. Four additional pins 207 are placed in adjacent pairs of plated thru holes at either side of the dashed lines marking the boundary between the rows. Each group of the extra pins 207 is adapted to receive a plug-on voltage crossover connector 209. Four discrete wires 211 are attached to the connector 209 and extend across the edge of the large card for attachment to a laminar bus not here shown. The four wires 211 each carry one of the supply voltages +3 v., −3 v., +6 v. or ground for distribution through the pins 207 to the voltage and ground planes 53 and 55.

Figure 13:
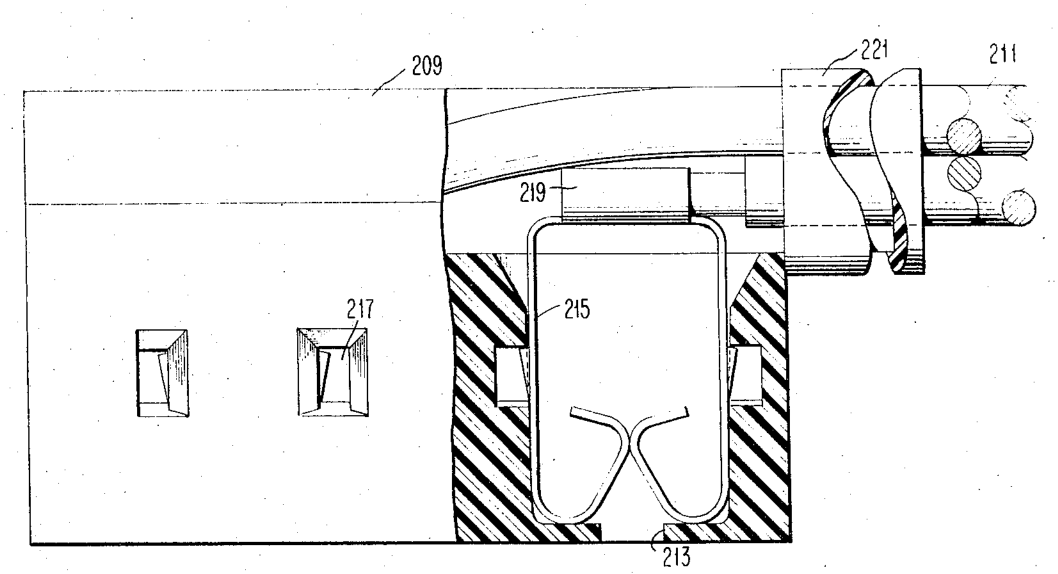
FIG. 13 is a side view of the connector shown in FIG. 11, portions being broken away to reveal interior detail.

The crossover connector 209 (FIG. 13) has an elongated rectangular plastic housing which has an inverted U-shape with holes 213 in the bottom for receiving the pins 207. Within the housing are four snap-in contacts 215 adapted to be inserted into the housing from the top and retained in apertures 217. The contacts 215 are basically U-shaped and have at their top a barrel 219 into which the stripped end of the wire 211 is soldered. Tubing 221 (not shown in FIG. 12) may be used to provide a sheathing for the four wires 211. In the event that special voltages are required, these can be transmitted from the laminar bus in a similar manner and distributed on the large card by means of discrete wiring, or if the volume is sufficiently high, by special printed circuit patterns on the innerplanes. This large card design is compatible with a type of large card not here illustrated for mounting lower density small cards wherein all the external wiring between pins is done by discrete wire wrapped wires. That is to say, the copper is etched off the surfaces of the large card except of course that covered by the square land areas 61 and printed wiring is not used. Furthermore some large cards for some low speed circuits may not require internal planes.

Figure 14:
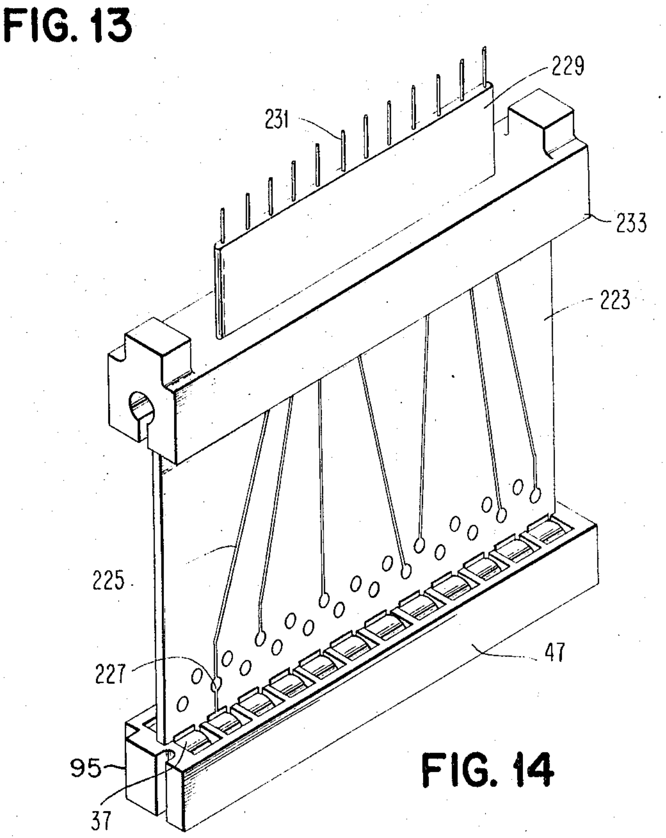
FIG. 14 is a perspective view of a cable card and attached flat cable.

The cable card 223 (FIG. 14) is a double-sided printed circuit card similar to the 6-pack small card 17 and has the same width. The connector for plugging the cable cards onto the pins on the large card 19 is the same as the small card connector and thus includes U-shaped contact springs 37 soldered to contact tabs on either side of the card 223 which are plugged onto the snap-on housing 47. The cable card 223 has a plurality of printed circuit lines 225 on either side of the card and may contain plated thru holes 227 to make through connections. The cable 229 is the type commonly known as flat cable or ribbon cable and contains a plurality of wires 231 sandwiched between layers of plastic which insulate the conductors and join them together. The end of the cable 229 is connected to the cable card 223 as for instance by stripping the end of the cable and soldering the bared conductors 231 to the printed circuit lines 225 on one or both sides of the card. A suitable strain relief device 233 clamps the cable 229 to the card above the soldered joints.

The cable cards and flat cable may be made in different sizes to provide the capacity desired for a particular application. Referring to FIG. 1, the cable card 223*a* is called a split 6-pack cable card because it is just half of the width of the 6-pack cable card 223, and the flat cable 229*a* and housing 47*b* have correspondingly reduced widths. Due to the freedom of arrangement of the small cards and cable cards on the large card, the cable to small card ratio can be varied as required.

The printed circuit package according to the invention has the circuit density needed to apply the supply voltages to the modules 15 and interconnect them with considerable flexibility. The rectangular grid of plated thru holes 39 on the small cards 17, 17*a*, 17*b* and 17*c* have a spacing to receive the terminal pins 23 of the modules 15 and also to mount various sizes of discrete components 45. Other devices such as relays or fuses can be mounted in the plated thru holes 39. At the same time, some of these plated thru holes provide the through connections between the printed circuitry on either side of the card or with the internal planes. It has also been mentioned previously that a design concept is that the socket has been placed upon the pluggable unit, i.e., the small card. This results in the socket only appearing when it is used, as blank positions do not have sockets since the small card is not present. Additionally, the large card 19 is designed so that both the small card and input cables are pluggable, and the same connector is used for both the small cards and the cable cards. Various ratios of small cards and cable cards can be used depending upon the need. An important advantage of the package is that the large card 19 is simple and inexpensive to manufacture. Engineering change activity by substituting one large card for another in the field is facilitated to an extent not achieved before. Repair of the large card by substitution is likewise convenient.

Other aspects of the economy of manufacture of the subject printed circuit package will be pointed out. Due to the similarity of construction of the small cards and the large cards, certain processing steps can be carried out in common. The rectangular grid of plated thru holes 57 in the large card 19 has the same spacing as the grid of plated thru holes 39 on the small cards. Furthermore, the holes can have the same diameter. All of the plated thru holes in both the small cards and the large cards (and also the cable cards) can therefore be largely processed in about the same manner using the same tools and equipment. The processing can be identical up to the electroplating copper step and the application of a resist. For the small card plated thru holes, there may be an electroplated tin-lead coating, an immersion tin coating or no coating at all. The small card processing includes the etching of printed circuitry, adding a protective coating, and assembly and soldering of modules and components.

In the manufacture of the large cards 19, after the plated thru holes 57 including an electroplated tin-lead coating have been processed, the pins 65 are inserted into the holes and swaged at either end (FIG. 11) to mechanically fasten them to the cards. Then the pins 65 are soldered to the large card by dropping a solder ring 201 down over the pin and dipping the card in hot oil or baking in an oven at about 390° F. for about four and one-half minutes. The addition of printed wiring to the external plane of the large card 19 is the final step in the processing (other than the addition of a protective coating). Etching of the printed circuit patterns in an acid such as ammonium persulfate or ferric chloride is possible at this point since the pins 65 and the plated thru holes with their coating of tin-lead are both acid resistant. Assuming that one or just a few standard internal plane patterns are used, this means that the final wiring pattern on the external planes can be put on after most of the processing steps have occurred. Thus standard large cards complete except for the final printed circuit "personality" wiring, can be stocked. Furthermore, the bulk of the process steps can be carried out under good control at a central processing plant, while the complete personality wiring can be done at other locations and other plants with a minimum of equipment in a relatively short time. The simple construction and low cost of the large cards makes it both feasible and economical to replace the large card in the field for repair and engineering changes.

The advantages of the use of the flexible cables 229 are obvious. By combining many conductors into an integral package, assembly costs are reduced. Furthermore, the cables 229 may be made in various capacities, i.e., containing from 6 to about 48 conductors. A flat cable having improved characteristics particularly for use in high speed circuit applications is described in the copending application of R. C. Paulsen, Serial No. 242,542, filed December 5, 1962, and assigned to the same assignee as the present invention.

While the invention has been particularly shown and described with reference to a preferred embodiment thereof, it will be understood by those skilled in the art that various changes in form and details may be made therein without departing from the spirit and scope of the invention.

What is claimed is:

1. A high density printed circuit package suitable for mounting in desired random relationship both discrete components and solid state circuit modules, said package comprising a multi-layered large printed circuit card, a plurality of small printed circuit cards, said large card and small cards having external printed wiring on both their sides and also having respective rectangular grids of identically spaced plated-thru holes extending therethrough from one such side to the other, a plurality of miniaturized solid state circuit modules each including a planar substrate and a grid pattern of terminal pins projecting from one surface thereof and into said plated-thru holes on respective small cards to mount such modules to the small cards, discrete components having leads fastened in others of said plated-thru holes to mount such components to at least one of said small cards, generally inverted U-shaped spring contacts fastened to both sides of each small card, rows of conductive pins secured in selected rows of plated-thru holes in said large card and projecting beyond both sides of the large card, a connector socket comprising an apertured insulative housing for receiving pairs of oppositely disposed spring contacts and a double row of those portions of the pins projecting from one side of said large card to retain the small card in predetermined removable right angle relation to the large card and permit transferral of electrical signals from the small card via the various spring contacts to the corresponding pins on the large card, and the other portions of the pins projecting from the other side of the large card being available as probe points, and selected ones of these other portions being interconnected by discrete wires.

2. The combination according to claim 1, wherein said large card has external signal planes including the printed wiring terminating at the plated-thru holes, at least two inner planes including a voltage distribution plane and a ground distribution plane, and non-conductive land areas surrounding those selected plated-thru holes at which no electrical connection is to be made to one of said inner planes.

3. The combination according to claim 1, including at least one cable card having spring contacts fastened thereto identical with those fastened to the small cards to permit them to be received in a connector socket of the same type as receives the small cards, and flat multiconductor cable secured to each such cable card at an edge thereof different from the edge to which the spring contacts are fastened.

References Cited by the Examiner

UNITED STATES PATENTS

| | | | |
|---|---|---|---|
| 2,707,272 | 5/1955 | Blitz | 339—17 |
| 2,904,768 | 9/1959 | Rasmussen | 339—17 |
| 2,907,925 | 10/1959 | Parsons | 317—101 |
| 2,929,965 | 3/1960 | Oden | 317—101 |
| 2,951,184 | 8/1960 | Wyma | 317—101 |
| 3,008,113 | 11/1961 | Johnson | 339—17 |
| 3,015,755 | 1/1962 | Wright | 317—101 |
| 3,059,152 | 10/1962 | Khouri | 317—101 |
| 3,072,874 | 1/1963 | Roney | 339—17 |
| 3,088,191 | 5/1963 | Bedson | 317—101 |

ROBERT K. SCHAEFER, *Primary Examiner.*

KATHLEEN H. CLAFFY, *Examiner.*

H. J. RICHMAN, W. C. GARVERT, *Assistant Examiners.*